(12) United States Patent
Joist

(10) Patent No.: US 7,284,997 B2
(45) Date of Patent: Oct. 23, 2007

(54) PLUG-IN MODULE FOR A MODULE FRAME

(75) Inventor: Michael Joist, Gaggenau (DE)

(73) Assignee: Schroff GmbH, Straubenhardt (DE)

( * ) Notice: Subject to any disclaimer, the term of this patent is extended or adjusted under 35 U.S.C. 154(b) by 0 days.

(21) Appl. No.: 10/806,718

(22) Filed: Mar. 23, 2004

(65) Prior Publication Data

US 2004/0192095 A1    Sep. 30, 2004

(30) Foreign Application Priority Data

Mar. 24, 2003  (DE) ................................ 103 13 119
Jun. 5, 2003    (EP) ................................ 03012750

(51) Int. Cl.
  *H01R 13/62* (2006.01)
(52) U.S. Cl. ....................... 439/157; 439/188; 439/911
(58) Field of Classification Search ................ 439/157, 439/188, 160, 911
See application file for complete search history.

(56) References Cited

U.S. PATENT DOCUMENTS

| | | | |
|---|---|---|---|
| 4,884,046 A * | 11/1989 | Spinner | 333/260 |
| 5,675,475 A | 10/1997 | Mazura et al. | |
| 5,940,276 A | 8/1999 | Kurrer et al. | |
| 5,989,043 A * | 11/1999 | Han et al. | 439/157 |
| 6,094,353 A | 7/2000 | Koerber et al. | |
| 6,128,198 A | 10/2000 | Kurrer et al. | |
| 6,220,879 B1 | 4/2001 | Ulrich | |
| 6,494,729 B1 * | 12/2002 | Stathopoulos et al. | 439/160 |
| 6,515,866 B2 | 2/2003 | Ulrich | |
| 6,741,479 B2 * | 5/2004 | Korber et al. | 361/801 |
| 2002/0057550 A1 * | 5/2002 | Ulrich | 361/600 |
| 2003/0194892 A1 | 10/2003 | Korber et al. | |
| 2004/0192095 A1 * | 9/2004 | Joist | 439/188 |
| 2005/0014403 A1 * | 1/2005 | Joist | 439/157 |

FOREIGN PATENT DOCUMENTS

| | | |
|---|---|---|
| DE | 4105948 | 8/1992 |
| EP | 832548 | 4/1998 |
| EP | 832547 | 1/1999 |
| EP | 958719 | 11/1999 |
| EP | 1017262 A1 | 7/2000 |
| EP | 1245139 | 10/2002 |
| WO | WO-9642186 | 12/1996 |
| WO | WO-02/19786 A1 | 3/2002 |

* cited by examiner

*Primary Examiner*—James R. Harvey
(74) *Attorney, Agent, or Firm*—Gardere Wynne Sewell LLP

(57) ABSTRACT

A plug-in module for the insertion into and extraction from a module frame that has at least one frontal structural bar, including a circuit board, a switch for the active-passive switching of the plug-in module and a swivel-mounted lever/pull handle with a gripper arm located in the frontal area of the plug-in module. The gripping arm of the lever/pull handle has a rotatably connected control lever with a stepping pawl by which the switch can be operated during a completely inserted plug-in module. The stepping pawl of the control lever can have a locking nose that can lock behind a locking edge in the front area of the plug-in module.

11 Claims, 4 Drawing Sheets

PLUG-IN MODULE FOR A MODULE FRAME

RELATED APPLICATIONS

This application claims priority under 35 U.S.C. 119 from German Application No. DE 103 13 119.1, filed Mar. 24, 2003 and EP Application EP 03 012 750.0 filed Jun. 5, 2003, both of which are incorporated herein by reference.

FIELD OF THE INVENTION

The invention concerns a plug-in-module for the insertion into and extraction from a module frame that has at least one frontal structural bar. The plug-in-module includes a circuit board, a switch for the active-passive switching of the plug-in-module and a swivel-mounted lever/pull handle with a gripper arm located in the frontal area of the plug-in module.

BACKGROUND

Insertion and extraction devices for the insertion and extraction of plug-in modules into and from module frames are known. Many different levers and lever/pull handles have been developed in the past for the insertion and extraction of the plug-in modules. One concern is that a plug-in module should only be switched to active when it is completely inserted into the module frame. Also, during extraction the module frame should be switched to passive before the extraction procedure is started. That way it shall be guaranteed that only current-free switched modules can be separated from the bus of the module frame or connected to the bus. Interferences of the module frame or influences of other plug-in modules due to the coupling or decoupling of a plug-in module that is live are avoided that way.

A module unit with a lever for the insertion of the module into a mounting device is known from the DE 41 05 948 C2. A gripping lever is swivel-mounted on a long lever arm of the lever. A springy locking device locks the lever if the module is completely inserted. The lock is disengaged by the rotation of the gripping lever. A switching device is located at the front of the plug-in module and is operated by the lever during the insertion or extraction of the module unit. With that it shall be guaranteed that the power supply of the module unit is only activated when all connections to the plug-in connections counterparts of the module frame are established. Since the lever itself triggers the switching process, a decoupling of the switch from the movement of the plug-in module is not possible. Especially during the insertion of the plug-in module the switching process occurs toward the end of the insertion movement at an undefined point, therefore still during the movement of the plug-in module.

The DE 195 07 712 C1 shows an insertion and extraction device for a plug-in module in which a pestle is arranged in a holding jack for the operation of a micro switch. A swivel lever for the insertion and extraction is formed by two partial levers that can be swiveled against each other and their outer lever has a shoulder that is located opposite of the pestle and their inner lever carries the push-off shoulder for the gripping on a structural bar of the module frame, whereby a spring is located between the two levers. This arrangement absolutely requires a holding jack on which the swivel lever is positioned and the pestle is adjustably guided. It is a further disadvantage, that the lever via the pestle can only operate the micro switch indirectly and that additionally the pestle only has a small area that affects the micro switch. This requires a very precise positioning of the elements and compliance with small production tolerances during the production and assembly.

The EP 0 832 548 B1 shows a front system of a flat module with a specific corner piece, a lever/pull handle that is located in the corner piece and a micro switch for the active-passive switching of the plug-in module. The operation of the micro switch, which is located on the circuit board, is caused by a mechanical key element on which the lever/pull handle is pushing. The shown arrangement absolutely requires a separate corner piece for the mounting of the lever as well the key element. The effect of the lever on the control element of the plug-in module is only realized trough the activation of the key element.

EP 1 017 262 A1 describes a plug-in module for a module frame that is operated with an in/out lever handle. A spring operated bolt is mounted to the on the in/out lever handle which locks the lever as soon as the plug-in module reached its final rear position. Additionally the bolt can also operate a control element for a passive-active switching of the plug-in module. The pushing down of the bolt causes a passive switching of the control element before the bolt releases the lever. For an active switching of the control element a bolting of the lever handle must have occurred. Since the bolt automatically locks when the lever reaches its final position, a clear separation of the insertion process of the plug-in module from the active-passive switching cannot be achieved.

A front element of a circuit board with a lever/pull handle is known from the EP 0 958 719 B1. The lever/pull handle is rotatable mounted at the corner of the front element and has a lock slide for the unlocking of the lever/pull handle. A control element is integrated into the front element in such a way that the long lever arm of the lever/pull handle can operate a switch clip of the control element. Disadvantages with this construction are that the lever/pull handle as well as the control element have to be arranged on the same front element. Furthermore it allows the operation of the switch by the lever/pull handle no clear separation of the insertion and extraction process of the plug-in module from the switching process.

A front system of a flat module with a corner piece on which a lever/pull handle is mounted is known from EP 0 832 547 B1. The lever/pull handle shows means for the fixation of the respective positions of the lever/pull handle. The lever/pull handle in its corresponding position operates a control element, which is also integrated at the corner piece. Disadvantageous with this variation is that the lever/pull handle directly affects the switch, which makes a decoupling of the insertion and extraction process from the switching process impossible. Additionally, the lever/pull handle as well as the control element must both be positioned at the corner piece.

EP 1 245 139 A1 shows an operating element for a flat module in which the operating lever is located rotatable at an end piece. The operating lever includes a lock slide, which operates a control element that is integrated in the end piece for the active-passive switching of the flat module. The lock slide however, is arranged in the lever/pull handle in such a way that during the insertion of the plug-in module by rotating of the operating lever an exact decoupling of rotation movement of the lever and switch effect cannot be guaranteed.

To guarantee a smooth concurrence of module frames, plug-in modules and levers from different manufacturers, the dimensions and arrangements of the individual elements are partially standardized. An industry standard is the Hot Swap specification PICMG, whose version 3.0 calls for a lever for the insertion and extraction of a plug-in module from a module frame. The lever on its long lever arm has a suited pawl, which operates a switch, arranged in the front area of the plug-in module, for the active-passive switching of the plug-in module when the lever reaches a final position. This lever is clearly smaller in its dimensions than the known levers with switching function. Disadvantages with this aforementioned lever is that the insertion and extraction process of the plug-in module cannot be reliably separated from the switching process.

SUMMARY

What is needed is to provide, with simple mechanical means, a reliable decoupling of the insertion and extraction process of the plug-in module from the active-passive switching of the plug-in module. Additionally, the device for the insertion and extraction of the plug-in module must comply with the dimensions required by the standards.

One embodiment includes a plug-in module for the insertion into and extraction from a module frame that has at least one frontal structural bar. The plug-in module includes a circuit board, a switch for the active-passive switching of the plug-in module and a swivel-mounted lever/pull handle with a gripper arm located in the frontal area of the plug-in module.

The gripper arm of the lever/pull handle carries a swiveling jointed control lever with a stepping pawl that operates the switch if the plug-in module is completely inserted. Only if the plug-in module is completely inserted into the module frame can the control lever, which is rotatable positioned at the gripper arm, reach its final position and operate the switch with its stepping pawl. That causes a strict separation between the insertion process of the plug-in module, which is initiated by the lever/pull handle, and the switching process of the active-passive switching of the plug-in module, which is done by the control lever. The clear separation of the switching during from the insertion of the plug-in module into the module frame reliably guarantees that the plug-in module is switched to active only after the complete insertion. Interferences of the bus system of the module frame that are caused by the coupling of active plug-in modules can safely be avoided that way.

Since the switch for the active-passive switching of the plug-in module can only be operated by the control lever with a completely inserted plug-in module, the plug-in module will be switched to passive prior to the extraction from the module frame. That ensures that no activated plug-in module is separated from the bus system of the module frame.

In one embodiment of the plug-in module, the stepping pawl of the control lever has a locking nose, which is lockable behind a locking edge in the front area of the plug-in module. The locking of the control lever makes an unintended or automatic movement of the control lever impossible. The locking of the control lever during a completely inserted plug-in module furthermore has the result that additionally the lever/pull handle is locked as well. An extraction of the plug-in module from the module frame is therefore only possible after the disengagement of the lock and unlocking of the lever/pull handle. The lock of the control lever will be disengaged in such a way that the locking nose of the control lever is moved from behind the locking edge. The disengagement of the lock can be coupled with the active-passive switching. In this case, the active-passive switching of the plug-in module is operated concurrent with the disengagement of the lever/pull handle. That guarantees, that prior to the extraction of the plug-in module from the module frame a passive switching of the plug-in module occurs. The locking edge, behind which the locking nose locks in, can be arranged directly on the circuit board, for example.

Advantageously, the plug-in module has a front plate with a void. The stepping pawl of the control lever grips through this void in the front plate. An edge of the void is hereby formed by the locking edge, behind which the locking nose of the stepping pawl locks in. The front plate closes the plug-in module in the frontal area and protects it against damages and soiling. The lever/pull handle, which is also arranged in the front area, will be swiveled in the direction of the front plate during the insertion of the plug-in module, so that the stepping pawl of the control lever reaches into the inside of the plug-in module through the void of the front plate. The stepping pawl can therefore still operate the switch that is located behind the front plate as soon as the control lever is in its final position and the plug-in module is completely inserted into the module frame. Therefore, the front plate with void also provides protection for the plug-in module without an interruption of the separation of the insertion/extraction process of the plug-in module and the active-passive switching. The front plate can have an additional cutout at its lower end, which voids and reshapes the lower area of the lever/pull handle.

Preferably the stepping pawl of the control lever has a switching area at its free end, which affects the switch for the active-passive switching of the plug-in module. The preferably flat switching area of the stepping pawl can correspond with a switching key at the switch, so that the dynamic effect of the stepping pawl on the switch improves. Such a design is especially advantageous for the use of micro switches, since here the switching area is relatively small. The switching area corresponding with the switch can also be minimized, so that even with the restricted room situation within the plug-in module an optimal switch movement is achieved.

Alternatively, the stepping pawl can have a switch cam at its free end that pushes on the switch. This design proves itself advantageous when the switch points with its switching key in the direction of the front area of the plug-in module. A special fit of the stepping pawl on the switch can be achieved with the switch cam. The switching effect and the power exertion of the stepping pawl on the switch are optimized. It is also imaginable to form a stepping pawl with switching area and switching cam to be able to operate several switches at the same time or in succession.

The switch for the active-passive switching can be designed as an electrical or optical switch. With an electrical switch the stepping pawl of the control lever acts on a switching key at the switch and generates an electrical signal, which can be directly processed by the electronic of the plug-in module. With the use of an optical switch a light beam, which is send from the switch, is either reflected by the stepping pawl of the control lever or interrupted by the stepping pawl for the operation of the switch. In both cases is the change of the optical signal converted into an electrical signal. The use of an optical switch can be advantageous if, for example, the light signal has to be transferred through an optical waveguide to a distant point of the plug-in module.

In a specifically advantageous variation the control lever has an operating arm that is U-shaped in cross-section. The gripping arm of the lever/pull handle can be swiveled between the two U-legs. The U-shaped operating arm therefore partially grips the gripping arm of the lever/pull handle and guides it between its two legs. This restricts the relative movement of the control lever to the preferred direction. The stability of the lever is increased. The U-shaped guide avoids a turning of the control lever against the lever/pull handle. That also optimizes the handling for the user. It is also advantageous, that the U-shaped operating arm is distinctively wider than the lever/pull handle. A manual operation of the operating arm by the user to disengage the lock and for the operation of the control lever, the lever/pull handle respectively, is improved. The handling of the lever/pull handle will therefore be more comfortable. As an alternative, the gripping arm of the lever/pull handle could also be U-shaped. The operating arm will then be guided between the U-legs of the lever/pull handle and swings in between the U-legs. In this variation the operating arm of the control lever can additionally be T-shaped, so that the T-back offers a wide contact surface for the guide by the user.

Preferably the U-back of the operating arm is aligned towards the plug-in module. With that, the operating arm is arranged in such a way, that the U-back is positioned between the plug-in module and the lever/pull handle. This increases the ease of handling the lever. In the first step of the movement of the control lever the operating arm is pushed in the direction of the lever/pull handle. This simultaneously causes a disengagement of the lock of the control lever. In the further process of the operation of the operating arm it will reach the lever/pull handle. The power that is applied on the operating arm will now be transferred to the gripping arm of the lever/pull handle and the swivel movement of the lever/pull handle begins. With that the plug-in module will be extracted from the module frame. This variation is optimal under ergonomic points of view and is considered very comfortable by the user.

In a further embodiment of the plug-in module according to the invention, a spring tongue is formed at the control lever. At the same time the lever/pull handle has a groove that reaches into the spring tongue. The tongue that reaches into the groove guarantees the creation of a home position for the control lever. Ideally this position is aligned in such a way that the stepping pawl of the control lever with its locking nose locks behind the locking edge. That leads to an automatic locking of the control lever if the plug-in module is completely inserted, so that the lever/pull handle as well is locked. At the same time the switch, which is operated by the stepping pawl, remains in its selected position. An accidental switching or disengagement of the lever/pull handle is impossible. A spring tongue that is at least a little bit elastic can restrict the mobility of the control lever. In this case the mobility of the control lever is determined by the size of the corresponding groove in the lever/pull handle. Preferably the spring tongue is formed elastically, so that the control lever can be moved without to much effort. The elastic spring tongue has the further advantage that the control lever can automatically be moved back into its home position.

DETAILED DESCRIPTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural changes may be made without departing from the scope of the present invention. Therefore, the following detailed description is not to be taken in a limiting sense, and the scope of the present invention is defined by the appended claims and their equivalents.

FIGS. 1a-1d show the lower corner area of a plug-in module 1 that is inserted into a module frame during the extraction process. Of the module frame only the lower structural bar 2 is illustrated.

Figure 1A:
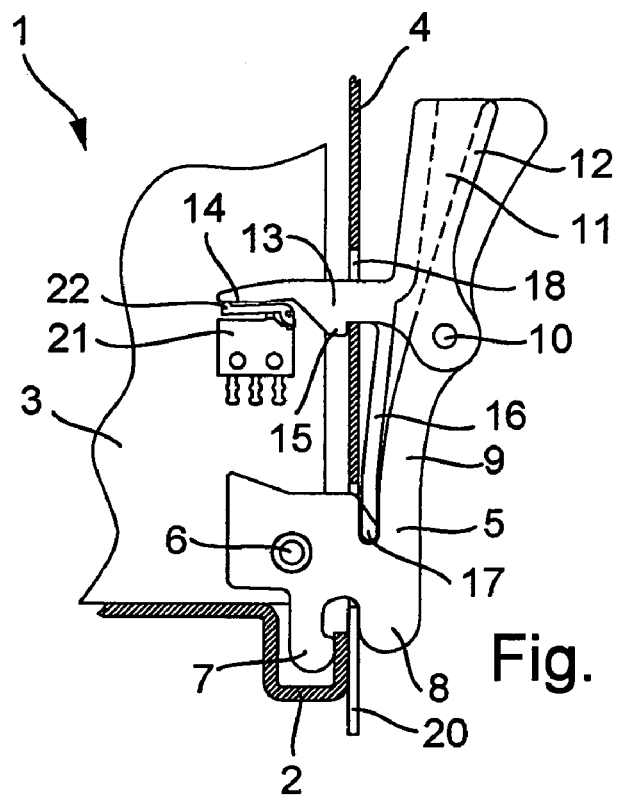
FIGS. 1a through 1d show the front corner area of a plug-in module with a lever/pull handle and swiveling jointed control lever, in different positions during the extraction of the plug-in module from the module frame, in each case viewed from the side.

The plug-in module 1 in FIG. 1a includes a circuit board 3, a front plate 4 and a lever/pull handle 5 that is rotatable arranged at the circuit board 3. A rotation bearing 6 is arranged in the corner area of the circuit board 3, around which the lever/pull handle 5 can swivel. The lever/pull handle 5 is at its lower end, near the rotation bearing 6, formed as a spur 7. The spur 7 grips into the structural bar 2 when the plug-in module 1 is completely inserted into the module frame. Parallel to the spur 7, turned away from plug-in module 1, the lever/pull handle 5 has a push-off shoulder 8. A gripping arm 9 extends from the push-off shoulder 8 upwards. The gripping arm 9 has a slightly bended form, so that its free end tilts away from the plug-in module. Approximately in the middle of the gripping arm 9, its outer side, turned away from plug-in module 1, is projected. A swivel bearing 10 is arranged in the area of the projection, around which a control lever 11 can be swiveled. The L-shaped control lever 11 has an operating arm 12 that extends along the gripping arm 9 and a stepping pawl 13 that points in the direction of the plug-in module 1.

The operating arm 12 has a U-shaped cross section. The two U-legs 12a, 12b (FIG. 3) frame the gripping arm 9, so that during the swiveling of the control lever 11 the gripping arm 9 is guided between the two U-legs 12, 12b. On the underside of its free end the stepping pawl 13 has a switching area 14, which is flat. A locking nose 15 is formed approximately in the middle and on the underside of the stepping pawl 13. The locking nose 15 is tilted towards the free end of the stepping pawl 13. The side of the locking nose 15 that faces the operating arm 12 runs right angular to the underside of the stepping pawl 13. From the underside of the stepping pawl 13 a spring tongue 16, which runs about parallel to the gripping arm 9 of the lever/pull handle 5, extends as an extension of the operating arm 12. The spring tongue 16 is about as long as the operating arm 12. The spring tongue 16 reaches into a groove 17 of the lever/pull handle 5, which is arranged at the lower end of the gripping arm 9.

The front plate 4 has a void 18 through which the stepping pawl 13 of the operating arm reaches when the gripping arm 9 of the lever/pull handle is aligned about parallel to the plug-in module 1 and to the front plate 4. At the same time the void 18 has a locking edge 19 behind which the locking nose 15 of the stepping pawl 13 locks. The tilted locking nose 15 can be pushed over the locking edge 19. The right angular arranged side of the locking edge 15 prevents that the locking nose 15 automatically disengages from the lock behind the locking edge 19.

A cutout 20 is located in the lower area of the front plate 4. The cutout 20 is formed in such a way that it frames the lower area of the lever/pull handle 5.

A switch 21 is located in the front area of the circuit board 3. The switch 21 has a switch key 22 that will be pushed down by the stepping pawl 13. During a completely inserted plug-in module 1 the switch key 22 of the switch 21 is pushed down by the stepping pawl 13 of the control lever 11. At the same time the locking nose 15 locks in behind the locking edge 19 of the front plate 4.

The spring tongue 16 that reaches into the groove 17 creates a pre-tension of the control lever 11, so that the operating arm 12 is pushed away from the gripping arm 9 and the stepping pawl 13 is therefore pushed down.

Figure 1B:
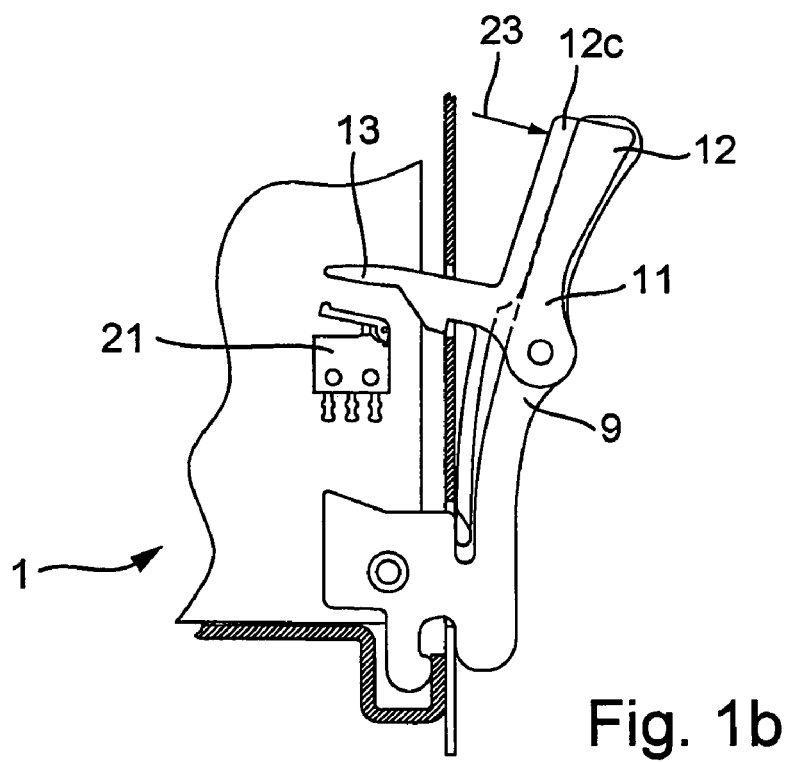
Figure 1C:
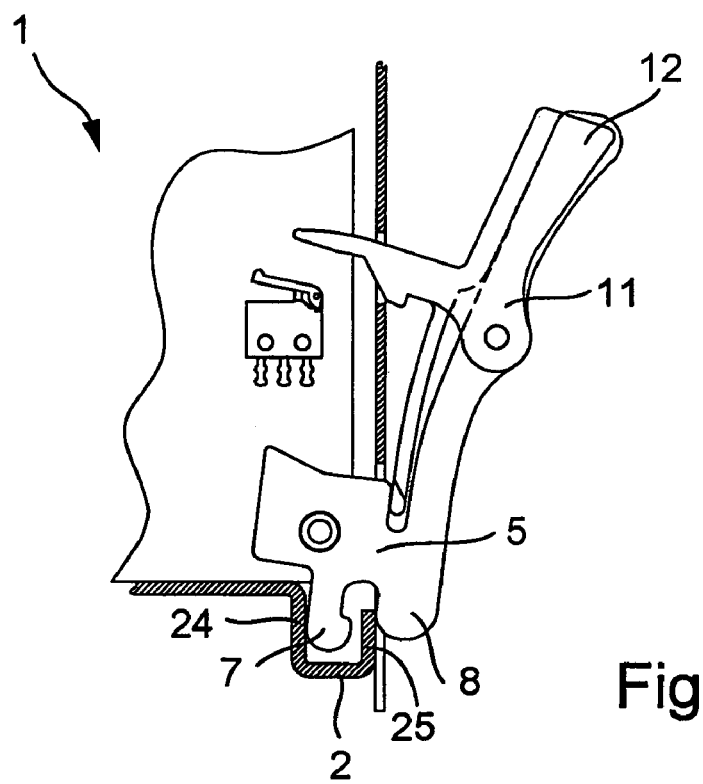

Before the extraction process of the plug-in module 1 from the module frame can start, the lock of the lever/pull handle 5, which is caused by the lock of the locking nose 15 with the locking edge 19, must be disengaged. To do that the operating arm 12 is pushed in the direction of the gripping arm 9. The arrow 23 in FIG. 1b illustrates this. The operating arm 12 is now aligned parallel to the gripping arm 9, whereby the rotation movement of the control lever 11 is restricted by the U-back 12c of the operating arm 12. The movement of the operating arm 12 is carried out against the pre-tension of the spring tongue 16. During the swiveling of the control lever 11 the stepping pawl 13 is moved away upwards by the switch 21, so that switch key 22 is released and the switch 21 switches. At the same time the lock for the locking nose 15 is released. At this point the position of the lever/pull handle 5 has not been changed yet, the extraction process of the plug-in module 1 did not start yet. Rather, the plug-in module 1 is still in its final position, whereas the active-passive switching of the plug-in module 1 by the switch 21 happened already. The plug-in module 1 is therefore switched to passive already at this point.

By a further swiveling of the operating arm 12 of the control lever 11 the power that applies on the control lever 11 is transferred on the lever/pull handle 5, so that now the extraction process of the plug-in module 1 from the module frame can start. The spur 7 touches in FIG. 1c with its front edge against the left inner wall 24 of the structural bar 2. At the same time the push-off shoulder 8 pushes off the outer wall 25 of the structural bar 2.

Figure 1D:
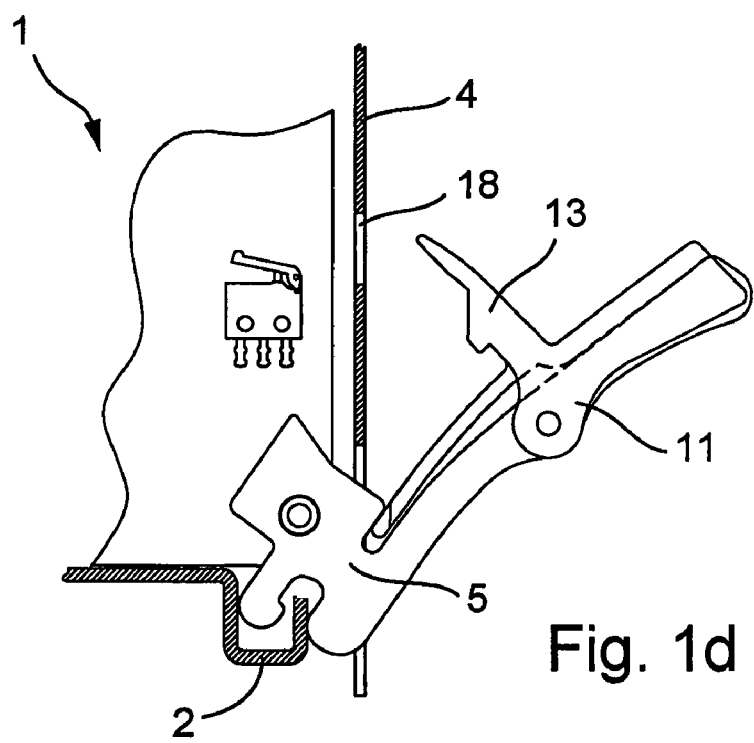

FIG. 1d finally shows the position of the lever/pull handle 5 in the further course of the extraction process. In the meantime the plug-in module 1 is partially extracted from the module frame, so that the front plate 4 is not positioned at the structural bar 2 anymore. The stepping pawl 13 of the control lever 11 was completely moved out of the void 18 of the front plate 4.

The insertion process of the plug-in module 1 into the module frame can be understood when the FIGS. 1a to 1d are looked at in reversed sequence.

Figure 2A:
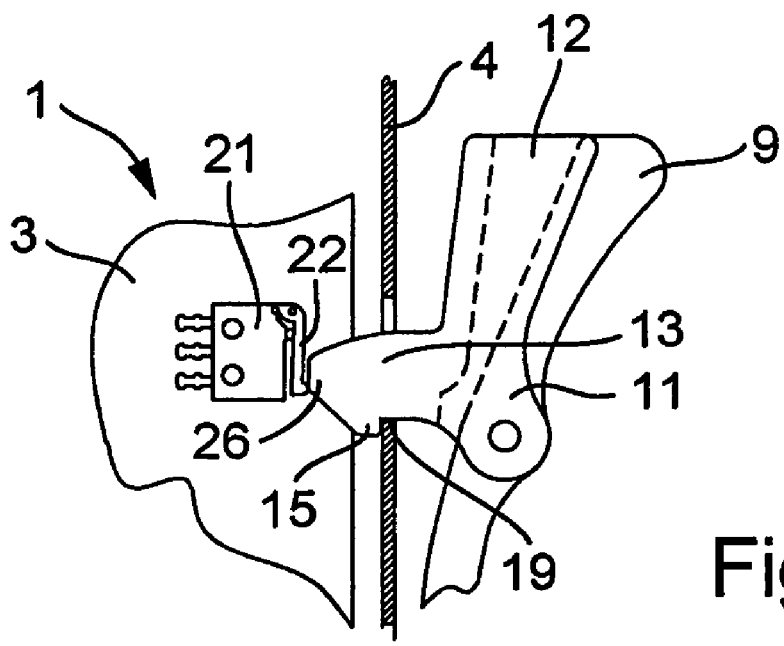
FIGS. 2a and 2b show an alternative design of the control lever with a switch cam, in sectional view.
Figure 2B:
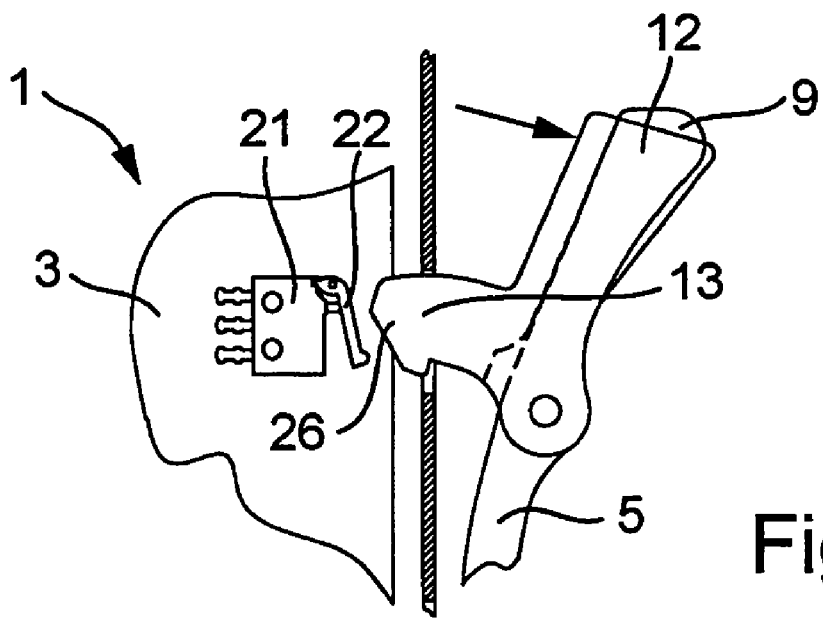

FIGS. 2a and 2b show an alternative second variation of the control lever 11. The stepping pawl 13 does not have a switching area anymore. Instead a switching cam 26 is formed at its free end. The use of such a control lever 11 with a switching cam 26 is advantageous if the switch is arranged on the circuit board 3 in such a way that the switch key 22 points in the direction of the front plate 4.

FIG. 2a shows a part of the completely into the module frame inserted plug-in module 1. The locking nose 15 is locked behind the locking edge 19 of the front plate 4. The switch cam 26 pushes the switch key 22 of the switch 21 down. The switch 21 remains in its switch position.

To now move the plug-in module 1 out of the module frame the operating arm 12 must be moved in the direction of the gripping arm 9, see FIG. 2b. That disengages the lock. At the same time, respectively before the disengagement of the lock, the switch 21 will be switched. In this variation with switch cam 26 as well, the active-passive-switching is operated by switching the switch 21 prior to the movement of lever/pull handle 5 and therefore prior to the start of the extraction of the plug-in module 1 from the module frame.

Figure 3:
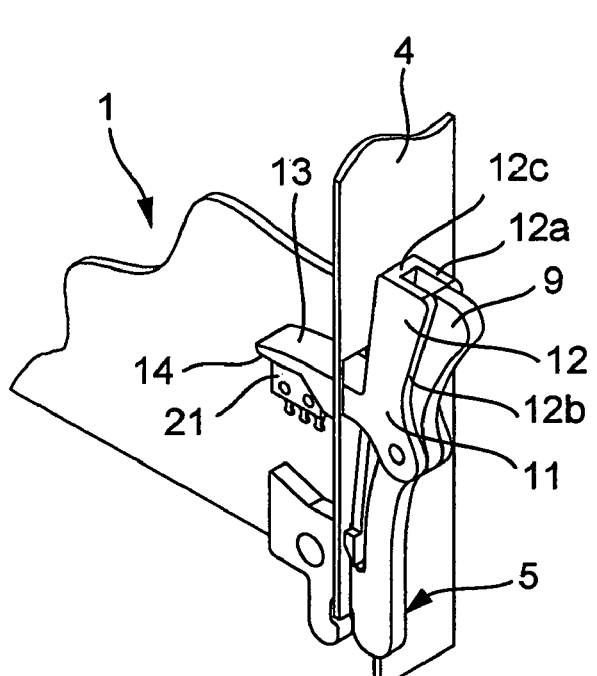
FIG. 3 shows a perspective illustration of the lower corner area of the plug-in module from FIG. 1.

FIG. 3 shows the lower front area of the plug-in module in perspective illustration, viewed from the front plate 4. With its U-shaped operating arm 12 the L-shaped control lever 11 encloses the gripping arm 9 of the lever/pull handle 5. The two U-legs 12a, 12b and the U-back 12c enclose the gripping arm 9. The operating arm 12 is therefore wider than as the gripping arm 9. The U-back 12c, through which the power on the control lever 11 and indirectly also on the lever/pull handle 5 is exercised, offers a larger operational area than the gripping arm 9, so that the handling of the lever is improved for the user. The U-shaped operation arm 12 restricts a swiveling of the control lever 11 against the lever/pull handle 5. The U-back 12c is in contact with the gripping arm 9. The power that is exercised by the user on the operating arm 12 is now directly transferred to the lever/pull handle 5, so that at last also the lever/pull handle 5 can be swiveled.

The stepping pawl 13 of the control lever 11 is as wide as the operation arm 12. With that the control lever 11 provides a switching area 14 that matches the stepping pawl 13. The switching area 14 is usually distinctively wider than the switch key 22 of the switch 21, which is designed here as a micro switch. That way, tolerances during the fit of the switch 21 to the control lever 11 can be equalized.

Figure 4:
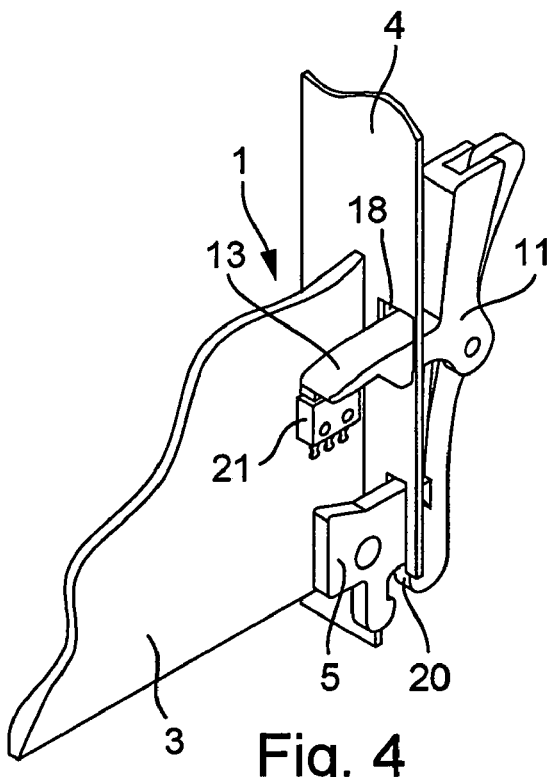
FIG. 4 shows another perspective illustration of the lower corner area of the plug-in module from FIG. 3.

FIG. 4 shows the lower corner area of the plug-in module 1 in perspective illustration, viewed from the plug-in module 1. Clearly visible is the stepping pawl 13 of the control lever 11 that reaches through the void 18 and pushes on the switch 21, which is located on the circuit board 3. The lower section 20 of the front plate 4 is formed in such a way that it just voids the lower area of the lever/pull handle 5. The lever/pull handle 5 reaches through the front plate 4.

Figure 5:
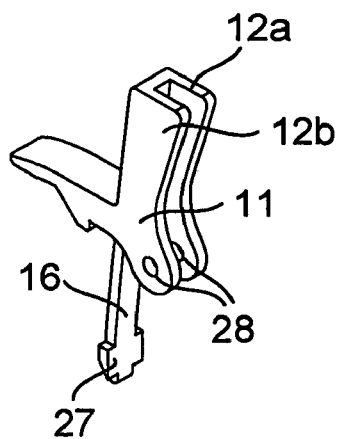
FIG. 5 shows the control lever from FIG. 3, perspective.

The perspective illustration of the control lever 11 in FIG. 5 clearly shows that the spring tongue 16 is designed as a cross at its lower end. The cross bar 27 reaches straight into the groove 17 of the lever/pull handle 5 when the lever is assembled. The cross bar 27 guarantees that the spring tongue 16 remains in the groove 17 even if the control lever 11 is rotated against the lever/pull handle 5.

At each of the lower end of the two legs 12a, 12b are bores 28 that are flush with each other. They take in the swivel bearing 10 around which the control lever 11 can be swiveled.

Figure 6:
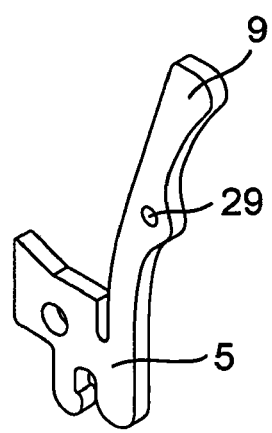
FIG. 6 shows the lever/pull handle from FIG. 3, perspective.

FIG. 6 shows in detail the lever/pull handle 5. In the middle of the gripping arm 9 is a bearing bore 29 that corresponds with the bores 28 of the control lever 11.

Figure 7:
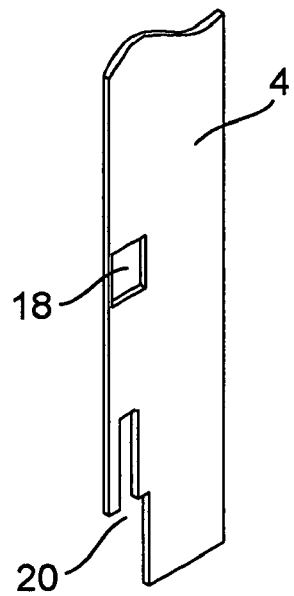
FIG. 7 shows the front plate of the plug-in module from FIG. 3, perspective.

The lower part of the front plate 4 is shown FIG. 7. At the left lower corner of the front plate 4 the clearly defined cutout 20 can be seen, which essentially matches the lever/pull handle 5. The square void 18 is arranged above the cutout 20.

It is understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A plug-in module for the insertion into and extraction from a module frame that has at least one frontal structural bar, comprising:
a circuit board;
a switch for active-passive switching of the plug-in module; and
a swivel-mounted lever/pull handle with a gripper arm located in a frontal area of the plug-in module;
wherein the gripper arm of the lever/pull handle carries a rotatably connected control lever with a stepping pawl to operate the switch when the plug-in module is completely inserted, wherein the control lever has an operating arm that is U-shaped in cross-section, between whose U-legs the gripping arm of the swivel-mounted lever/pull handle can be swiveled.

2. The plug-in module of claim 1, wherein a U-back of the operating arm is aligned towards the plug-in module.

3. A plug-in module for insertion into and extraction from a module frame that has at least one frontal structural bar, comprising:
a circuit board;
a switch for active-passive switching of the plug-in module; and
a swivel-mounted lever/pull handle located in a frontal area of the plug-in module, the lever/pull handle including a gripper arm which is an integral part of the lever/pull handle; and
a control lever which is rotatably connected to the gripper arm of the lever/pull handle, wherein the control lever includes a stepping pawl to operate the switch when the plug-in module is completely inserted, wherein a spring tongue is coupled to the control lever and the swivel-mounted lever/pull handle has a groove into which the spring tongue grips.

4. A plug-in module for the insertion into and extraction from a module fame that has at least one frontal structural bar, comprising:
a circuit board
a switch for active-passive switching of the plug-in module;
a lever/pull handle located in a frontal area of the plug-in module, the lever/pull handle supported on the circuit board at a rotation bearing for swivel movement of the lever/pull handle with respect to the circuit board, the lever/pull handle including an elongated gripper arm having a free end; and
a control lever mounted on the lever/pull handle at a swivel bearing between the free end of the gripper arm and the rotation bearing, the control lever including an operating arm extending in one direction adjacent to the gripper arm and between the gripper arm and the circuit board and a pawl extending toward the circuit board and engageable with the switch when the plug-in module is inserted in the frame and whereby the lever/pull handle may be grasped at the operating arm to move the operating arm in the direction of the gripper arm and away from the circuit board to disengage the pawl from the switch and move the lever/pull handle to cause the plug-in module to move with respect to the frame.

5. The plug-in module set forth in claim 4 wherein:
the pawl includes a locking nose engageable with a locking edge in the frontal area of the plug-in module.

6. The plug-in module set forth in claim 5 wherein:
the plug-in module includes a front plate including a void which forms the locking edge through which the pawl projects.

7. The plug-in module set forth in claim 4 wherein:
the pawl includes a part which is engageable with the switch.

8. The plug-in module set forth in claim 7 wherein:
the pawl includes a part comprising a cam engageable with the switch.

9. The plug-in module set forth in claim 4 including:
a spring member connected to the control lever and extending generally between the rotation bearing and the swivel bearing and urging the control lever in a position for causing the pawl to lock the control lever in engagement with the switch.

10. The plug-in module set forth in claim 4 wherein:
the lever/pull handle includes a spur engageable with the module frame for retaining the plug-in module engaged with the module frame.

11. The plug-in module set forth in claim 10 including:
a push-off shoulder engageable with the module frame in response to the lever/pull handle being pulled in the direction of the gripper arm to disengage the pawl from the switch to assist in removing the plug-in module from the module frame.

* * * * *